(12) United States Patent
Martin

(10) Patent No.: US 6,358,771 B1
(45) Date of Patent: Mar. 19, 2002

(54) LOW OXYGEN ASSEMBLY OF GLASS SEALED PACKAGES

(75) Inventor: John R. Martin, Foxborough, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/109,434

(22) Filed: Jul. 2, 1998

(51) Int. Cl.[7] .................. H01L 21/44; H01L 21/48; H01L 21/50
(52) U.S. Cl. .................. 438/106; 438/115; 438/117
(58) Field of Search ................................. 438/106–126

(56) References Cited

U.S. PATENT DOCUMENTS

| | | | | |
|---|---|---|---|---|
| 3,631,589 A | * | 1/1972 | Garceau | 29/588 |
| 3,697,797 A | * | 10/1972 | Freyheit et al. | 313/217 |
| 4,347,074 A | * | 8/1982 | Inohara et al. | 65/32 |
| 4,357,356 A | * | 11/1982 | Joulin | 426/19 |
| 4,537,467 A | | 8/1985 | Dubon et al. | 350/96.2 |
| 4,622,084 A | * | 11/1986 | Chang et al. | 156/89 |
| 4,766,027 A | | 8/1988 | Burn | 428/210 |
| 4,769,345 A | | 9/1988 | Butt et al. | 437/217 |
| 5,331,454 A | * | 7/1994 | Hornbeck | 359/224 |
| 5,578,863 A | * | 11/1996 | De Pooter | 257/433 |
| 5,682,065 A | | 10/1997 | Farnworth et al. | 257/727 |
| 5,694,740 A | | 12/1997 | Martin et al. | 53/431 |
| 5,736,607 A | | 4/1998 | Martin et al. | 524/609 |
| 5,801,309 A | * | 9/1998 | Carr et al. | 73/514.29 |
| 5,936,758 A | * | 8/1999 | Fisher et al. | 359/224 |

OTHER PUBLICATIONS

Michael Pecht, ed. Handbook of Electronic Package Design, Marcel Dekker: New York, pp. 21–23, 767–772, 1991.*

* cited by examiner

Primary Examiner—Charles Bowers
Assistant Examiner—Erik Kielin
(74) Attorney, Agent, or Firm—Hale and Dorr LLP

(57) ABSTRACT

A micromachined accelerometer is hermetically sealed in a reduced oxygen environment to allow organics to survive high temperature sealing processes.

21 Claims, 1 Drawing Sheet

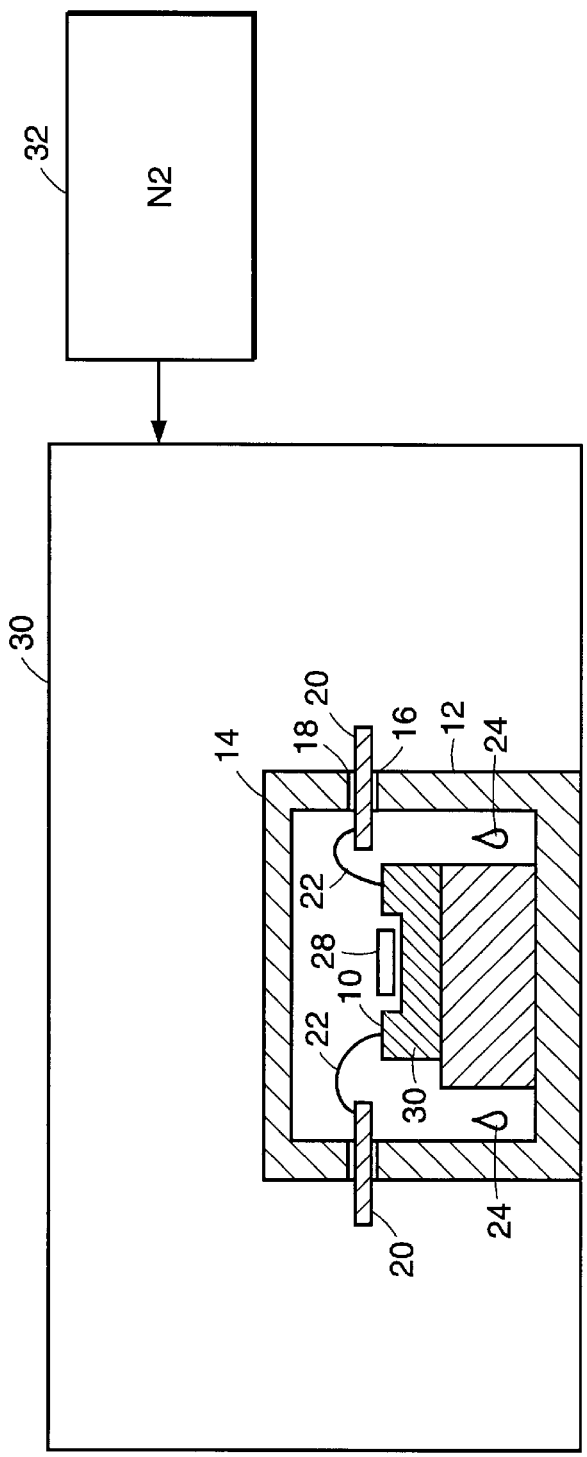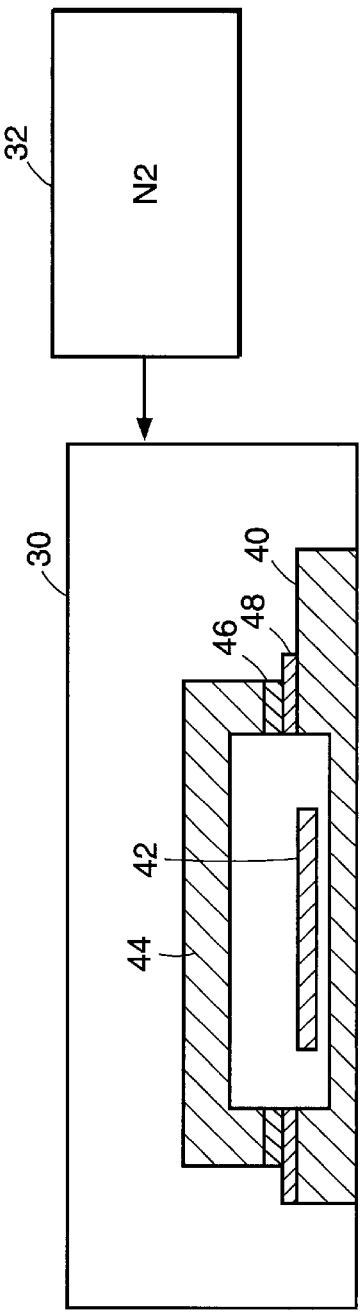

LOW OXYGEN ASSEMBLY OF GLASS SEALED PACKAGES

BACKGROUND OF THE INVENTION

This invention relates to the packaging of semiconductor devices, and particularly to packaging micromachined accelerometers.

Glass sealed ceramic packages have been used in the IC industry for a number of years and in a number of applications, including for packaging micromachined accelerometers. In these packages, a die is mounted in a container, e.g., with a silver-glass paste. The container has an open top and a lid, each of which has a mating glass layer. Leads are placed across the glass layer of the container. The container with the device is heated in air to 400–450° C. to sinter the inorganics, volatilize the organics in the paste, and embed the leads in the glass layer on the container. The leads are wire-bonded to bond pads on the device. The lid is placed over the container, and the assembly is again heated to 400–450° C. in air to seal the packages. In this latter heating process, the seal glass layers soften and fuse to form a hermetic seal. A process of this general type (but with some differences) is described in U.S. Pat. No. 5,736,607, which is expressly incorporated herein by reference for all purposes.

A surface micromachined accelerometer has closely spaced mechanical structures. These structures have high energy surfaces that will tend to stick together if they come in contact, in which case the device may be rendered nonfunctional. One way to reduce surface energy and to passivate the surface to prevent such stiction is to deposit a thin organic coating, as described in U.S. Pat. No. 5,694,740, which is expressly incorporated herein by reference for all purposes. In one embodiment, for example, a small amount of an organic material is provided in a container. The material vaporizes and is thus deposited on the micromachined structure during the heating/sealing processes. Few organic materials suitable as coatings can survive heating processes performed in air for hermetically sealing containers. Such temperatures may currently be as low as about 300° C., and often above 400° C.

SUMMARY OF THE INVENTION

The present invention includes a process for hermetically sealing a semiconductor device, either at the wafer level with a cap over the device or a portion of the device, or in sealing a device in a container, such as a cerdip or cerpac. According to the present invention, the device may be sealed at the wafer level with a cap or in a container in a reduced oxygen environment that has a nonzero amount of oxygen that is less than the 21% oxygen found in ambient air (referred to as a "reduced oxygen environment"). The amount of oxygen is preferably 0.1%–15%, more preferably 1%–10%, still more preferably 2%–4%, and most preferably about 3% oxygen.

The device is preferably a semiconductor device that has a movable component that is used as a sensor, more preferably a micromachined accelerometer, and still more preferably a surface micromachined accelerometer. The accelerometer preferably has a mass suspended over and parallel to a substrate, tethered to be movable along a sensitive axis, and having fingers extending away and between fixed fingers to form differential capacitive cells.

The method of the present invention is further preferably used in conjunction with a process for sealing a semiconductor device with a movable (relative to a substrate) component in which an organic material, in solid, liquid, or vapor form is introduced into a package and heated to coat the movable component to prevent or reduce the risk of stiction in the device or to control electrical characteristics. Alternatively, the device may be coated with the organic material before the heating and sealing.

Another method of the present invention is the use of a reduced oxygen environment when hermetically sealing an organic component, particularly when the seal is formed from glass, in order to reduce the oxidation of an organic component, while providing a non-zero quantity of oxygen to ensure that the seal is formed properly (in the case of glass, so that the glass wets to form a strong and reliable hermetic seal). The amount of oxygen is preferably 0.1%–15%, more preferably 1%–10%, still more preferably 2%–4%, and most preferably about 3% oxygen.

In the case of an organic coating applied directly on a device in small quantities, e.g., by evaporating or through other semiconductor processes, rather than introducing drops of liquid and vaporizing, the package may be sealed with a small amount of oxygen, e.g., less than 4%, down to an oxygen-free environment because there is less organic material that can affect the quality of a hermetic seal.

Other features and advantages will become apparent from the following detailed description, drawings, and claims.

BRIEF DESCRIPTION OF THE DRAWINGS

FIG. 1 is part cross-section, part functional diagram showing a device packaged according to the present invention.

FIG. 2 is a cross-sectional view of a device being sealed according to another embodiment of the present invention.

DETAILED DESCRIPTION

FIG. 1 shows a semiconductor device 10 in a package that has a container 12 and a lid 14. Container 12 and lid 14 each has a glass seal layer 16, 18 where the two meet. Between the glass layers are leads 20 connected with wire bonds 22 to bond pads on device 10. Container 12 also encloses an organic material, represented as drops 24, that is vaporized during a heating process (and may be during sealing) that causes glass seal layers 16, 18 to fuse together to seal the device in the package. The organic material can be in solid or liquid form, and is preferably one of the materials recited in the incorporated U.S. Pat. No. 5,694,740. Silicone has been found to be useful for coating surfaces of a movable micromachined device.

Device 10 is preferably a surface micromachined accelerometer that includes a movable mass represented as mass 28 suspended over and parallel to a substrate 30 as represented in FIG. 1 and shown in more detail in a number of patents, including, for example, U.S. Pat. Nos. 5,621,157 and 5,748,004, each of which is expressly incorporated by reference for all purposes.

Device 10 in container 12 is provided in a furnace 30 that has a reduced oxygen environment. While this oxygen reduction can be accomplished in a number of ways, one way is to introduce nitrogen (N2), represented as an N2 source 32, into furnace 30 to reduce the percentage of oxygen below the ambient air level of approximately 21% oxygen. The N2 is introduced with sufficient gas flow to reduce the level of oxygen to a reduced level, preferably 0.1%–15%, more preferably 1%–10%, still more preferably 2%–4%, and most preferably approximately 3%.

It is known that to provide a good hermetic seal with common seal glasses, it is undesirable to have a vacuum and thus substantially oxygen-free environment because oxygen enables the molten glass to wet mating surfaces. Seals produced in oxygen-free processes are weaker and often less hermetic than those produced in similar processes in which oxygen is present. With an organic material being packaged, such as a micromachined device with an organic antistiction coating, it is desirable not to have oxygen used during sealing. It has been found, as described herein and according to the present invention, that surface wetting to form a hermetic seal does not require 21% oxygen as found in air, and that a reliable, robust seal can be formed when smaller, and even much smaller, amounts of oxygen is present. Thus it is desirable to have oxygen present for wetting and sealing, and it is also desirable to eliminate the amount of oxygen that can adversely affect a packaged organic material. It has been found that the oxidation of a passivation/anti-stiction coating can be substantially reduced if the seal process is conducted with a reduced oxygen environment, preferably only a few percent oxygen; meanwhile, because some oxygen is present, seal integrity is not compromised.

The present invention is described in terms of ceramic packages with a glass seal, but also includes packaging a device with a glass sealed cover as shown in FIG. 2. A die 40 with a movable mass 42 is partially covered by a lid 44 that covers at least the movable mass. The lid or die or both have a seal layer 46, 48, such as glass layers. In many applications, the glass layer is applied to only one of the mating surfaces. This makes it more difficult to achieve a strong hermetic seal because the glass must bond to a dissimilar material.

Torque tests and liquid-liquid thermal shock tests (−65° C. to +150° C.) were performed and showed that seal quality is not degraded when oxygen was reduced to 2.3%. Tests were performed on cerpacs which had 0.4 to 2 mg of silicone dispensed into the packages with semiconductor devices with micromachined accelerometers before the package was hermetically sealed. Tests were performed at a number of different ratios, including 7%, 4.3%, 3%, 2.3%, and 1%. Some of the silicone will degrade to form a variety of products including $CO_2$, benzene, and methane. Reducing the oxygen level in the seal furnace reduces oxidation of the silicone as shown by a progressive reduction in $CO_2$ level. The fact that pyrolysis gases (methane and benzene) are also reduced suggests that partial oxidization of silicone molecules increases their susceptibility to pyrolysis. All these levels of oxygen provided satisfactory results, with the amounts below 4% being particularly beneficial.

The organics in die attach paste are more volatile and less thermally stable than potential wafer coatings. Consequently, they will be removed even when the OBO oxygen level is low. The validity of this assertion may vary depending on the specific die attach product. QMI 2419, provided by Quantum Materials, Inc. of San Diego, Calif., is a widely used silver-glass and is used in cerdips and cerpacs. Organics would be easier to remove from other die attach products like QMI 3555. However, even QMI 2419 is amenable to low oxygen OBO processing.

If organics remains in the die attach, they will oxidize to $CO_2$ when the device is sealed. Thus, an elevated $CO_2$ level, excessive oxygen decrease, or a large change in cavity pressure would be indicative of residual organics. It was found that residuals were insignificant with QMI 2419, even when the OBO gas was reduced to 3% oxygen.

Having described embodiments of the present invention, it should be apparent that modifications can be made without departing from the scope of the present invention as defined by the appended claims. As noted above, a low amount, and even zero oxygen, may be used in the case of a micromachined device coated with a small quantity of an organic material, e.g., by evaporation.

What is claimed is:

1. A method comprising hermetically sealing a semiconductor device that has a substrate and a component formed over the substrate and movable relative to the substrate in a container, the sealing being performed in a reduced oxygen environment.

2. The method of claim 1, wherein the container has a body and a lid, and wherein one of the body and the lid has glass seal for contacting the other of the body and the lid.

3. The method of claim 1, wherein the device is sealed in an environment that has 1%–10% oxygen.

4. The method of claim 1, wherein the device is sealed in an environment that has 2%–4% oxygen.

5. The method of claim 1, wherein the device is sealed in an environment that has approximately 3% oxygen.

6. The method of claim 1, wherein the component is sealed with a cap over the movable component.

7. The method of claim 1, wherein the container has a body and a lid, and wherein both the body and the lid have a glass seal layers that fuse together to seal the container.

8. The method of claim 1, wherein the container is a cerdip.

9. The method of claim 1, wherein the container is a cerpac.

10. The method of claim 1, wherein the device is sealed in a package with an organic material that passivates a surface of the movable component.

11. The method of claim 1, wherein the device is sealed with a cap over the movable component to define a cavity, wherein the organic material is provided in the cavity to passivate a surface of the movable component.

12. A method comprising sealing a surface micromachined accelerometer in a reduced oxygen environment in a closed container with an organic material, the sealing including heating the package to a sufficient temperature to vaporize the organic material inside the container, and to melt a sealing material in order to seal the device in the container.

13. The method of claim 12, wherein the organic material is in solid form.

14. The method of claim 12, wherein the organic material is in liquid form.

15. The method of claim 12, wherein the organic material is silicone.

16. The method of claim 12, wherein the sealing includes introducing a gas other than oxygen to mix with air to reduce the amount of oxygen to a desired level.

17. The method of claim 12, wherein the container has a body and a lid, and wherein one of the body and the lid has a glass seal for contacting the other of the body and the lid.

18. The method of claim 12, wherein the device is sealed in an environment that has 1%–10% oxygen.

19. The method of claim 12, wherein the device is sealed in an environment that has 2%–4% oxygen.

20. The method of claim 12, wherein the device is sealed in an environment that has approximately 3% oxygen.

21. The method of claim 12, wherein the container has a body and a lid, and wherein both the body and the lid have glass seal layers that fuse together to seal the container.

* * * * *